United States Patent
Botker

(10) Patent No.: US 8,866,553 B2
(45) Date of Patent: Oct. 21, 2014

(54) OUTPUT STAGE WITH FAST FEEDBACK FOR DRIVING ADC

(71) Applicant: Linear Technology Corporation, Milpitas, CA (US)

(72) Inventor: Thomas Lloyd Botker, Andover, MA (US)

(73) Assignee: Linear Technology Corporation, Milpitas, CA (US)

( * ) Notice: Subject to any disclaimer, the term of this patent is extended or adjusted under 35 U.S.C. 154(b) by 64 days.

(21) Appl. No.: 13/829,517

(22) Filed: Mar. 14, 2013

(65) Prior Publication Data

US 2014/0266840 A1 Sep. 18, 2014

(51) Int. Cl.
*H03F 3/45* (2006.01)
(52) U.S. Cl.
USPC .............................................. 330/260; 330/99
(58) Field of Classification Search
USPC ........................................... 330/260, 99, 310
IPC ............................................................ H03F 3/45
See application file for complete search history.

(56) References Cited

U.S. PATENT DOCUMENTS

| | | | |
|---|---|---|---|
| 3,708,624 A * | 1/1973 | Boxall | 370/202 |
| 3,997,779 A * | 12/1976 | Rabl | 250/207 |
| 4,596,029 A * | 6/1986 | Manueco Santurtun et al. | 378/105 |
| 6,653,891 B1 * | 11/2003 | Hazucha | 327/540 |
| 2012/0299564 A1 * | 11/2012 | Howes et al. | 323/281 |
| 2014/0103893 A1 * | 4/2014 | Bhattad et al. | 323/273 |

* cited by examiner

*Primary Examiner* — Patricia Nguyen
(74) *Attorney, Agent, or Firm* — Patent Law Group LLP; Brian D Ogonowsky

(57) ABSTRACT

A driver for an analog-to-digital converter (ADC) has an overall feedback loop between its input and its output for maintaining overall accuracy, and a much faster feedback loop in its output stage that quickly compensates for output transients before the overall feedback loop can substantially react to the transients. Output voltage transients are created by the intermittent capacitive load of the ADC. The fast feedback loop can be made very fast since there are only a few components in the fast feedback path. The fast reduction of the output transients enables a shorter sampling time, leading to more accurate analog-to-digital conversion. The overall gain of the driver can be set to be greater than unity while still providing good output transient suppression.

21 Claims, 2 Drawing Sheets

OUTPUT STAGE WITH FAST FEEDBACK FOR DRIVING ADC

FIELD OF THE INVENTION

This invention relates to drivers for driving analog-to-digital converters (ADCs), where the ADC provides an intermittent capacitive load on the driver output and, more particularly, to such a driver that quickly corrects for transients in its output voltage due to a transient capacitive load.

BACKGROUND

A common type of ADC charges one or more capacitors with an instantaneous analog voltage at a sampling time. After the capacitors are charged, the sampling time ends, and the capacitors are isolated from the source of the analog voltage signal. A digital representation of the sampled voltage is then generated. In some ADC's, the sample rate can be very high, resulting in high frequency transients.

In a typical ADC system, the analog signal used to charge the capacitors is generated by a driver (typically a unity gain buffer) that receives the source analog input voltage and ensures that the analog signal into the ADC is of a sufficient current. The driver may form a front end of an ADC integrated circuit. Such a driver should, ideally, provide an analog signal to the ADC capacitors during the sampling time that is not affected by any in-rush current into the ADC. However, there will always be some distortion of the analog signal, due to in-rush current transients, at the end of the sampling time when the analog output signal of the driver is charging the capacitors. Such distortion limits the minimum sampling time.

The ideal driver must have an output that is not affected by the transients. The typical driver uses a single feedback loop between its input and output for maintaining accuracy and load drive.

Although it may be desirable to operate a driver in high closed loop gain to improve the signal to noise ratio into the ADC, a high gain driver does not have the ability to adequately respond to the output transients caused by the in-rush current into the ADC. This is because an amplifier's bandwidth, and its ability to respond to transients, decreases with increases in its closed loop gain. Therefore, prior art drivers for an ADC typically operate in unity gain.

What is needed is a driver for an ADC that has a very good (i.e., fast) response to output transients and is able to operate in a high closed loop gain to improve the signal to noise ratio of the system.

SUMMARY

A driver for an ADC has an amplifier stage and an output stage. The ADC provides an intermittent capacitive load on the driver. The driver has an overall feedback loop between its input and its output and a much faster feedback loop in its output stage that compensates for output transients before the overall feedback loop can react to the transients. The fast feedback loop can be made very fast since there are only a few components in the fast feedback path. Accordingly, the output stage has a high bandwidth and improved accuracy due to the local feedback. The output stage may have unity gain.

Since the output stage provides a fast response to output transients, the overall gain of the driver may be high (i.e., has a low overall bandwidth), to provide an improved signal to noise ratio, without adversely affecting the driver's ability to respond to the output transients. The fast reduction of the transients enables a shorter sampling time, leading to more accurate analog-to-digital conversion. The fast feedback loop in the output stage also saves power by eliminating the need for an additional unity gain buffer after a gain stage to settle the ADC transients.

The compensation of the amplifier stage (e.g., using a compensation capacitor) is isolated from the driver output stage to reduce output transients that are fed back through the compensation capacitor.

BRIEF DESCRIPTION OF THE DRAWINGS

Elements that are the same or equivalent are labeled with the same numeral.

DETAILED DESCRIPTION

Figure 1:
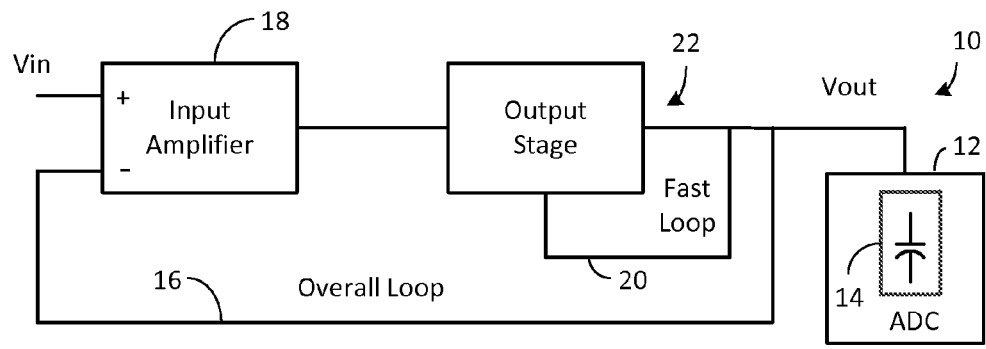
FIG. 1 is a block diagram illustrating the concept of the invention.

FIG. 1 illustrates a driver 10 for an ADC 12. The ADC 12 is any ADC that provides a capacitive load on the output of the driver 10. It is important that the driver 10 be controlled by feedback to maintain accuracy, so the driver 10 provides an output voltage Vout to the input terminal of the ADC 12 that is an accurate reproduction of the analog input voltage Vin at the time that the ADC is sampling Vout.

The ADC 12 periodically samples Vout and places a capacitive load 14 on the output of the driver 10. Although a single capacitor is shown in FIG. 1 as the capacitive load 14, the capacitor 14 may represent one or a bank of weighted capacitors used in conventional ADCs.

Figure 2:
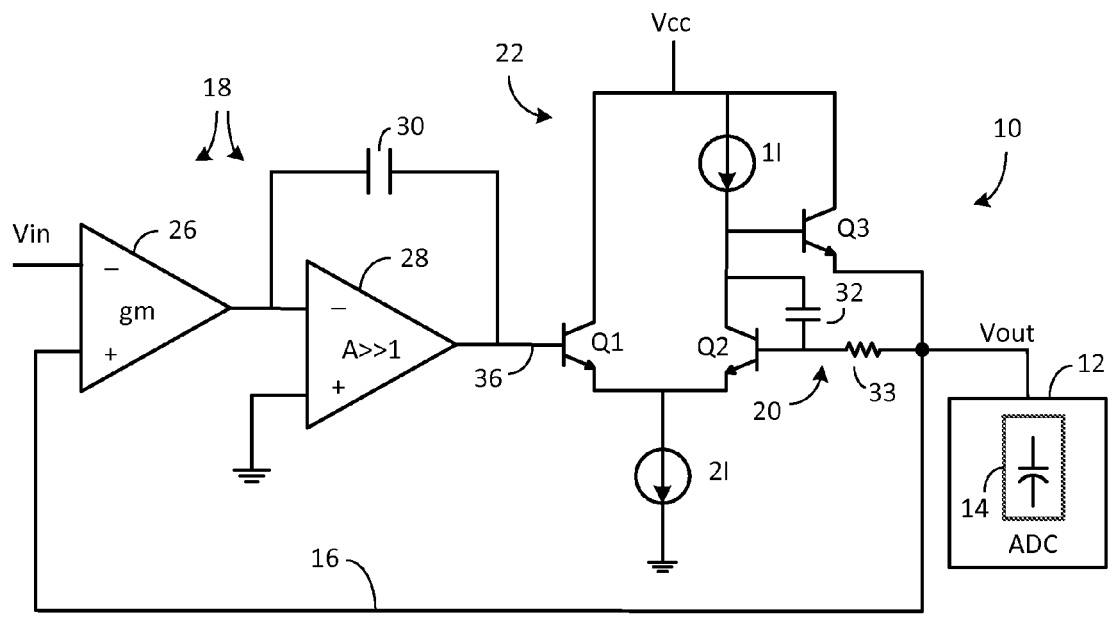
FIG. 2 illustrates a more detailed embodiment of the invention showing the overall feedback loop, for maintaining accuracy, and the fast feedback loop, for reducing ADC-related transients.

To set the desired gain of the driver, an overall feedback loop 16 is used to cause Vout to be approximately proportional to Vin (including being equal to) by applying Vout to an inverting input of a differential input amplifier 18, while the source analog voltage Vin is applied to the non-inverting input. The overall gain (Vout/Vin) of the driver 10 may be unity if Vout is directly applied to the inverting input, or the gain can be any other amount if a resistor divider or other network is connected between Vout and the inverting input. Having a high gain can increase the signal to noise ratio of the ADC system. Within the input amplifier 18, there is typically a high gain amplifier. In the example of FIGS. 1 and 2, a differential amplifier at the front end, in conjunction with the feedback of Vout, causes the driver 10 to have unity gain. The response of the overall feedback loop 16 should be set to be slower than the fast feedback loop 20 in the output stage 22 (e.g., 5 to 12 times slower) to avoid stability problems. When operating at high closed loop gains, the relatively slow speed of the overall feedback loop 16 is, however, not adequate to compensate for the fast transients that occur when the ADC 12 samples Vout due to the in-rush current when charging the capacitive load 14 to Vout. Without effectively dealing with such transients, Vout would be distorted, limiting the precision of the ADC 12 measurement.

The output stage 22 is designed to settle the transients for the particular ADC to be driven, since different ADC's may operate at different speeds and use different digitizing techniques.

A fast feedback loop 20 is provided in an output stage 22 of the driver 10. In one embodiment, the output stage 22 has unity gain and a very high bandwidth to enable a very fast feedback loop 20. The fast feedback loop 20 is made to be as fast as possible, while maintaining stability, by limiting the number of components in the loop and having a fast time constant. Since the expected transient characteristics are known, the required performance of the fast feedback loop 20 can be optimally designed to substantially eliminate the transients before the overall feedback loop 16 has time to react to the transients. As soon as the ADC 12 begins to sample Vout and pulls Vout down or up due to in-rush current, the fast feedback loop 20 reacts to pull Vout back up or down, while the overall feedback loop 16 is substantially not affected by the transient. Vout may be pulled down or up since the initial voltage on the ADC capacitor(s) 14 may be above or below Vout at the start of the sampling time.

Thus, the overall feedback loop 16 is optimally set to maintain accuracy, while the fast feedback loop is optimally set to quickly settle the ADC-related transients. Any small perturbations of Vout that remain after the correction by the fast feedback loop 16 are settled by the overall feedback loop 16. Ideally, the fast feedback loop 20 settles the transients to be below the least significant bit (LSB) of the ADC 12.

In one embodiment, the ratio of the time constant (TC) of the overall feedback loop 16 and the time constant of the fast feedback loop 20 is preferably greater than 5. Although a much higher TC ratio is better for settling transients, more power is used by a small TC circuit. Thus, a good practical range for the TC ratio is 5-12. The absolute values for the time constants depend on the frequencies of the input and output signals.

FIG. 2 illustrates a more detailed embodiment of the invention. The input amplifier 18 includes a front-end differential amplifier 26, providing a transconductance gm, and a high gain stage comprising another differential amplifier 28. Additional amplifier stages may be used. The gain of the amplifier 28 is preferably much greater than unity to provide accurate control of Vout. An integrating capacitor 30, connected between the output of the amplifier 28 and its inverting input, limits the bandwidth of the input amplifier 18 and causes the time constant of the overall feedback loop 16 to be much higher than the time constant of the fast feedback loop 20 in the output stage 22. The value of the capacitor 30 is selected to cause the overall feedback loop 16 to pass the desired input signal frequency and further settle any transients that were not settled by the fast feedback loop 20.

The compensation capacitor 30 is connected solely within the input amplifier 18 so that the compensation is isolated from the driver output stage to further reduce output transients fed back into the input amplifier 18 via the compensation capacitor 30. In the prior art, a compensation capacitor is typically connected between a node in an input amplifier and a node in an output stage, so output transients are coupled into the input amplifier.

In the example of FIG. 2, the non-inverting input of the high gain amplifier 28 is connected to AC ground so that the amplifier 28 inverts and amplifies the signal from the amplifier 26. In an alternative embodiment (shown in FIG. 3), the output of the differential amplifier 26 is differential, and the inputs of the amplifier 28 are connected to the differential output of the differential amplifier 26.

The output stage 22 includes a differential amplifier comprising transistors Q1 and Q2. Transistor Q3 is connected as a unity gain emitter follower to provide a lower impedance output for the output stage 22 to further improve the stability of Vout. The capacitor 32 and resistor 33 in the fast feedback loop 20 create a small (fast) time constant RC, where $1/RC \gg gm/capacitor\ 30$, where gm is the transconductance of the amplifier 26, in order for the fast feedback loop 20 to correct for output transients before the overall feedback loop 16 can significantly react to the transients. The time constant of the fast feedback loop 20 needs to be selected to settle the output transients. Accordingly, the analog voltage on line 36 applied to the output stage 22 is substantially unaffected by the in-rush transients during sampling by the ADC 12.

The output load transients are further isolated from the input amplifier 18 by the transistors Q1 and Q2.

The resistor 33 represents any resistive element, which includes an equivalent resistive element. Such alternative resistive elements include a MOSFET operating in its triode mode or a transistor circuit providing an equivalent transconductance (V/I).

Figure 3:
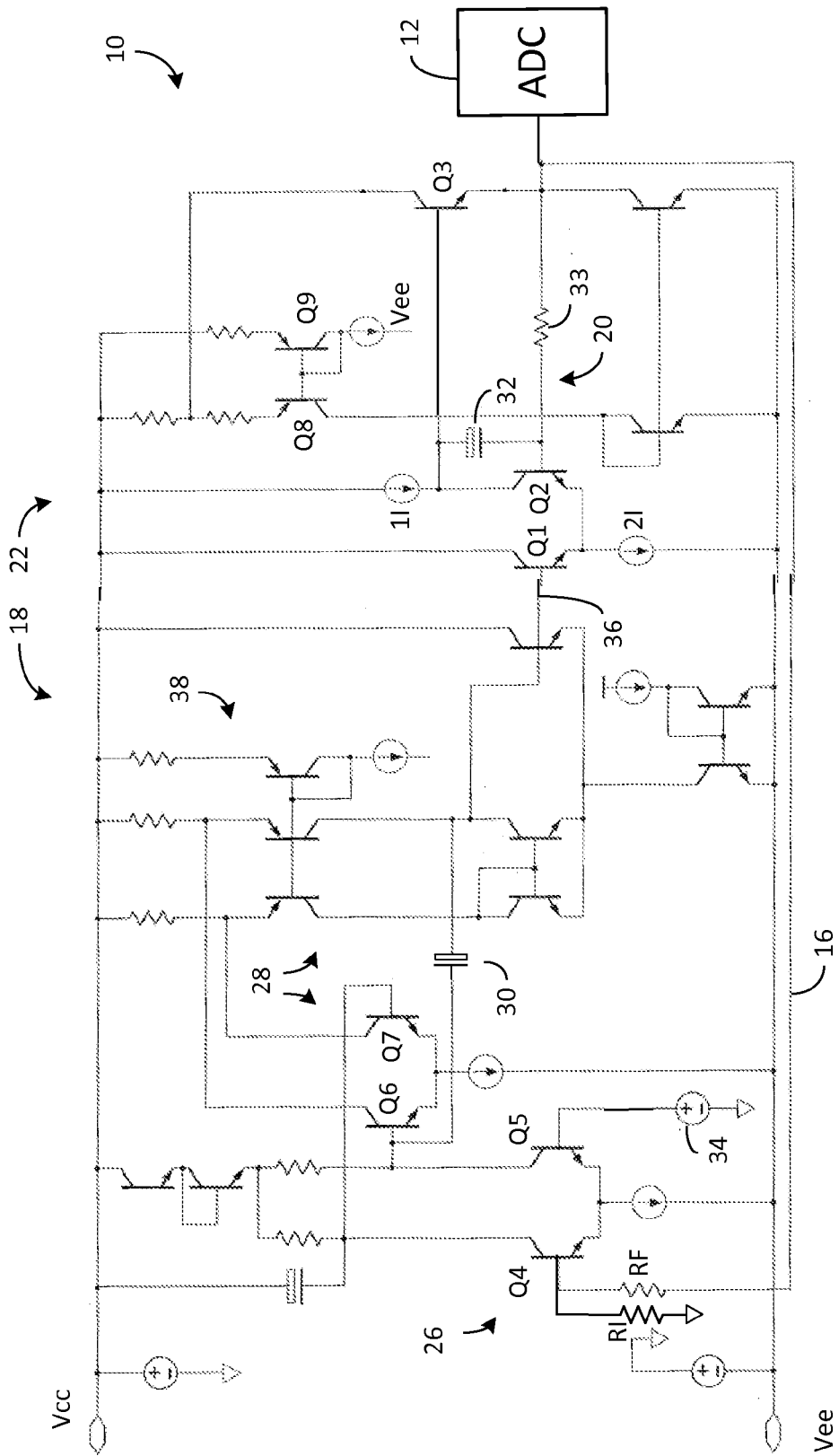
FIG. 3 is a schematic circuit diagram of one embodiment of the invention used to analyze the performance of the inventive circuit with a simulated ADC.

FIG. 3 is a schematic circuit diagram of one embodiment of the invention used to analyze the performance of the inventive circuit with a simulated ADC. In one example, Vcc is 15 volts and Vee is −15 volts. FIG. 3 identifies the input amplifier 18, including the amplifier 26 and gain stage (amplifier 28). The amplifier 26 includes the transistors Q4 and Q5. The voltage source 34 is used to simulate an analog input voltage and can be controlled during the simulation.

The amplifier 26 provides a differential output to the gain stage 28. The transistor Q6 is the inverting input of amplifier 28, which is connected to the capacitor 30, and the transistor Q7 is the non-inverting input. The output of the amplifier 28 is on line 36, providing the input signal to the output stage 22. The simulation showed that the voltage on line 36 is substantially unaffected by transients at Vout as a result of the fast feedback loop 20 including the additional isolation provided by transistors Q1 and Q2.

Circuitry 38 is part of the amplifier 28 and provides level shifting.

The overall feedback loop 16 tries to make the inputs into transistors Q4 and Q5 the same.

The output stage 22 in FIG. 3 includes transistors Q1 and Q2, discussed with respect to FIG. 2, where transistor Q2 is part of the fast feedback loop 20. The output stage 22 also includes transistors Q8 and Q9, forming a mirrored current source for biasing the emitter follower transistor Q3.

The gain of the driver in FIG. 3 is determined by the values of RI and RF (connected as a resistor divider), where Vout= (1+RF/RI)*Vin. A gain of 1-100 may be typical.

A circuit simulating the ADC 12 switches in and out a variety of capacitors at various speeds to simulate a variety of transient conditions.

Those skilled in the art would understand the operation of the circuit of FIG. 3 in view of the functional description above.

Although, the driver 10 in the examples of FIGS. 1 and 2 has been shown as having unity gain, since Vout is fed back to the input, a higher gain driver may be created by providing a resistor divider between Vout and ground and feeding back the divided voltage to the inverting input. This would improve the signal to noise ratio of the ADC system since Vout would be an amplified version of Vin, and the driver would still be able to settle the ADC transients.

Although the driver 10 has been described as being particularly advantageous for driving an ADC, it is equally as beneficial for driving any transient load where a very accurate and stable output voltage is desired.

While particular embodiments of the present invention have been shown and described, it will be obvious to those skilled in the art that changes and modifications may be made without departing from this invention in its broader aspects.

The appended claims are to encompass within their scope all such changes and modifications as fall within the true spirit and scope of this invention.

What is claimed is:

1. A circuit comprising:
a driver comprising:
an input amplifier including a differential input amplifier having a first input terminal for receiving an input voltage;
an output stage coupled to receive a signal from the input amplifier and providing an output voltage at an output terminal;
an overall feedback loop feeding back a first voltage, corresponding to the output voltage of the driver, to a second input terminal of the differential input amplifier, the overall feedback loop having a first time constant,
wherein the input amplifier further comprises a high gain amplifier having a capacitor connected between its output and its input to set a time constant of the overall feedback loop; and
a fast feedback loop within the output stage, the fast feedback loop having a second time constant smaller than the first time constant, the fast feedback loop reducing transients in the output voltage so as to reduce effects of the transients on the overall feedback loop.

2. The circuit of claim 1 wherein the first time constant is greater than five times the second time constant.

3. The circuit of claim 1 wherein the first time constant and second time constant are set to maintain stability.

4. The circuit of claim 1 wherein the differential input amplifier is a transconductance amplifier.

5. The circuit of claim 1 wherein the output stage has unity gain.

6. A circuit comprising:
a driver comprising:
an input amplifier including a differential input amplifier having a first input terminal for receiving an input voltage;
an output stage coupled to receive a signal from the input amplifier and providing an output voltage at an output terminal;
an overall feedback loop feeding back a first voltage, corresponding to the output voltage of the driver, to a second input terminal of the differential input amplifier, the overall feedback loop having a first time constant; and
a fast feedback loop within the output stage, the fast feedback loop having a second time constant smaller than the first time constant, the fast feedback loop reducing transients in the output voltage so as to reduce effects of the transients on the overall feedback loop,
wherein the output stage comprises a first differential amplifier having two inputs, a first input being an output of the input amplifier, and a second input being coupled to the output terminal of the driver as part of the fast feedback loop.

7. The circuit of claim 6 wherein the fast feedback loop comprises:
a bipolar transistor connected to an output of the first differential amplifier as an emitter follower, wherein the output terminal of the driver is coupled to the emitter of the bipolar transistor;
a resistive element coupled between the output terminal and the second input of the first differential amplifier; and
a capacitor coupled between the second input of the first differential amplifier and the output of the first differential amplifier.

8. The circuit of claim 1 wherein the first time constant is 5-12 times greater than the second time constant.

9. The circuit of claim 1 wherein a gain of the driver is unity.

10. The circuit of claim 1 wherein a gain of the driver is greater than unity.

11. The circuit of claim 1 wherein the first voltage approximately equals the output voltage of the driver.

12. The circuit of claim 1 wherein the first voltage equals a divided output voltage of the driver.

13. The circuit of claim 1 further comprising an analog-to-digital converter (ADC) coupled to the output terminal of the output stage, wherein the ADC provides an intermittent capacitive load to the driver.

14. A circuit comprising:
a driver comprising:
an input amplifier including a differential input amplifier having a first input terminal for receiving an input voltage;
a compensation capacitor for the driver connected solely within the input amplifier;
an output stage coupled to receive a signal from the input amplifier and providing an output voltage at an output terminal;
an overall feedback loop feeding back a first voltage, corresponding to the output voltage of the driver, to a second input terminal of the differential input amplifier, the overall feedback loop having a first time constant; and
a fast feedback loop within the output stage, the fast feedback loop having a second time constant smaller than the first time constant, the fast feedback loop reducing transients in the output voltage so as to reduce effects of the transients on the overall feedback loop.

15. A method performed by a driver having an output terminal coupled to an input of an analog-to-digital converter (ADC), wherein the ADC provides an intermittent capacitive load to the driver, the method comprising:
receiving an input voltage at a first input terminal of an input amplifier of the driver;
outputting, by an output stage of the driver, an output voltage at the output terminal of the driver;
feeding back, by an overall feedback loop, a first voltage, corresponding to the output voltage of the driver, to a second input terminal of the input amplifier, the overall feedback loop having a first time constant, wherein the input amplifier comprises a high gain amplifier having a capacitor connected between its output and its input to set a time constant of the overall feedback loop; and
feeding back, by a fast feedback loop in the output stage, a second voltage, corresponding to the output voltage of the driver, to a feedback terminal in the output stage, the fast feedback loop having a second time constant smaller than the first time constant,
wherein the fast feedback loop reduces transients in the output voltage due to the intermittent capacitive load so as to reduce effects of the transients on the overall feedback loop.

16. The method of claim 15 wherein the first voltage approximately equals the second voltage.

17. The method of claim 15 wherein the second voltage approximately equals the output voltage of the driver.

18. The method of claim 15 wherein the first voltage approximately equals the output voltage of the driver.

19. The method of claim 15 wherein the first voltage equals a divided output voltage of the driver.

20. The method of claim 15 wherein the first input terminal and the second input terminal are input terminals to a transconductance amplifier in the input amplifier.

21. The method of claim 15 wherein the first time constant is greater than five times the second time constant.

* * * * *